United States Patent [19]

Yoder

[11] Patent Number: 5,334,853

[45] Date of Patent: Aug. 2, 1994

[54] SEMICONDUCTOR COLD ELECTRON EMISSION DEVICE

[75] Inventor: Max N. Yoder, Falls Church, Va.

[73] Assignee: The United States of America as represented by the Secretary of the Navy, Washington, D.C.

[21] Appl. No.: 128,508

[22] Filed: Sep. 29, 1993

[51] Int. Cl.$^5$ .................................. H01L 29/161
[52] U.S. Cl. ........................... 257/10; 257/11; 257/77; 257/12
[58] Field of Search .............. 257/10, 11, 12, 26, 257/29, 77, 78; 313/446, 447

[56] References Cited

U.S. PATENT DOCUMENTS

| | | | |
|---|---|---|---|
| 4,000,503 | 12/1976 | Matare | 257/10 |
| 4,040,080 | 8/1977 | Hara et al. | 257/10 |
| 4,063,269 | 12/1977 | Hara et al. | 257/11 |
| 4,063,276 | 12/1977 | Hara et al. | 257/11 |
| 4,382,837 | 5/1987 | Rutz | 156/610 |

OTHER PUBLICATIONS

3rd International Conference on Amorphous & Crystalline Silicon Carbide and Other Group IV–IV Materials, Apr. 11–13, 1990, G. L. Harris, et al.
Philips Technical Review–Silicon Cold Cathodes, vol. 43, No. 3, Jan. 1987, G. G. P. Van Gorkom, et al.
Electronics Letters, Aug. 1, 1991, vol. 27, No. 16, M. E. Kordesh et al, "Cold Field from CVD ... microscopy".

*Primary Examiner*—Rolf Hille
*Assistant Examiner*—Minhloan Tran
*Attorney, Agent, or Firm*—William F. McCarthy; Thomas E. McDonald; James T. Busch

[57] ABSTRACT

A semiconductor cold electron emission device comprising a type I heterojunction formed of a P-type semiconductor mixture of AlN and a N-type semiconductor mixture of SiC which junction is forward biased so that electrons are monoenergetically emitted from the P-type semiconductor mixture.

10 Claims, 2 Drawing Sheets

SEMICONDUCTOR COLD ELECTRON EMISSION DEVICE

BACKGROUND OF THE INVENTION

This invention relates to electron emission devices. In particular, the invention is concerned with high efficiency semiconductor cold cathodes which employ new P-N combinations of materials to form heterojunctions.

Considerable work has been done in the field of cold cathodes. Avalanche-type cold cathodes have been constructed of silicon. A discussion of this work is reported in Philips Technical Review, VOL. 43, No. 3, Jan. 1989 by G.G.P. van Gorkom and A.M.E. Hoeberechts. Unfortunately, silicon cathodes suffer from poor efficiency, e.g., ~1%. Such cathodes reverse bias a semiconductor junction into avalanche and because the excitons, i.e., hole-electron pairs, are generated at varying locations and in a random process, the electrons reaching the surface of the cathode have a bell-shaped energy distribution of which only the tail end of the bell exceeds the work function of silicon and are emitted.

Various schemes have been proposed to use GaAs, AlAs, and alloys thereof to accelerate electrons to energies exceeding the work function of GaAlAs or cesiated GaAlAs. These approaches, unfortunately, have severe limitations. The cesiated surfaces are extremely fragile in that cesium is a highly reactive element and even minuscule exposure to virtually any contaminant will poison the surface. GaAs has a work function of 4.7 eV necessitating very high "hot" energies of electrons within the GaAs. These high energies cause the upper conduction band valleys to be populated and in so doing, the electrons become heavy and slow down thus greatly defeating the purpose of this approach. The bare GaAlAs surface is also easily poisoned by contaminants.

Diamond is thought to have a negative electron affinity surface and has been shown by M. Kordesch of Ohio University to act as a cold cathode as disclosed in Electronics Letters, 1 Aug. 91, VOL. 27, No. 16. Diamond has the added advantage that its surface, once terminated by hydrogen, is extremely stable and virtually impossible to contaminate. Unfortunately, there are no known impurities with which to reliably and controllably render diamond N-type; damage-induced N-type-activity in diamond is virtually impossible to adequately control.

In experiments by the applicant and others, AlN (aluminum nitride) has recently been shown to exhibit a negative electron affinity surface. AlN and SiC (silicon carbide) have recently been shown to form miscible alloys over the entire mole fraction compositional range and heterojunctions of AlN and SiC have also been demonstrated as have heterojunctions with AlN and AlSiCN. While N-type impurity doping of AlN is difficult because the material must be absolutely free of oxygen, it is possible. A good discussion of some recent work with SiC-AlN mixtures is contained in the "3rd International Conference on Amorphous and Crystalline and Other Group IV-IV Materials", APR 11-13, 1990, G. L. Harris, et al. Additional details regarding it are found in U.S. Pat. No. 4,382,837.

SUMMARY OF THE INVENTION

The invention includes cold electron emission semiconductor devices wherein a heterojunction is formed by at least two semiconductors, one of which is P-type material and one of which is N-type material.

By using aluminum nitride (AlN) and silicon carbide (SiC) in semiconductor compositions, a Type I heterojuntion can be formed which overcomes disadvantages of the prior art.

There are many advantages to our emission device. Unlike avalanche type devices, our cold cathode is highly efficient and the energy is monoenergetic. The electron energy of our device can be controlled and modulated unlike single composition negative electron devices such as diamond or AlN. There is no N-type doping problem, no requirement for heat as in a thermonic device, no large, non-uniform concentration of current to cause degradation and no chance of poisoning the emission capability when the device is exposed to oxygen, hydrogen or air.

DESCRIPTION OF PREFERRED EMBODIMENT

Figure 1:
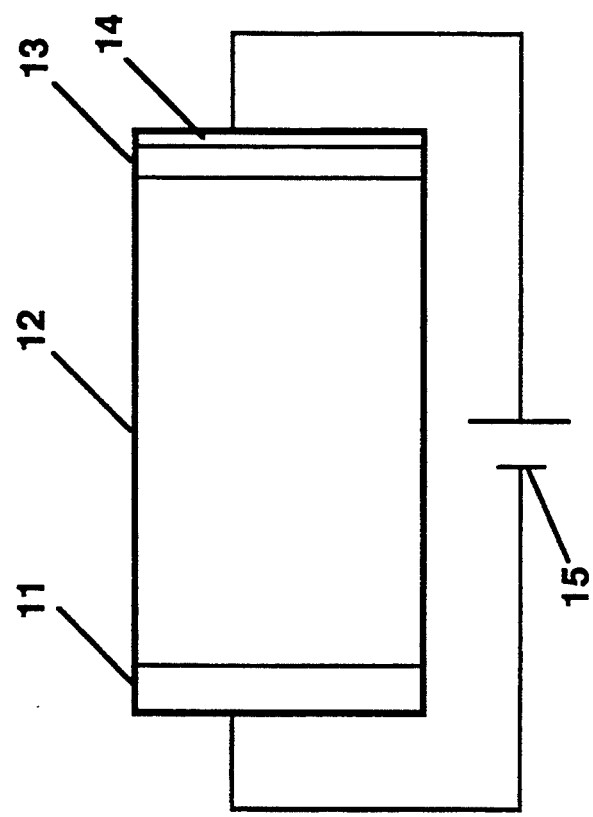
FIG. 1 is a side view of elements of the invention.

Referring to FIG. 1, there is shown metallic ohmic contact 11, N-type semiconductor material 12 which can be AlN or AlSiCN, P-type semiconductor material 13 which can be SiC or AlSiCN and a metallic ohmic contact 14. The contacts 11 and 14 are continuous with the N-type semiconductor material 12 and the P-type semiconductor material 13, respectively. The junction formed by semiconductor materials 12 and 13 is forwarded biased by an appropriate source shown as 15, which should be large enough to overcome the energy gap between the two semiconductor materials. This would generally exceed 2eV depending on the materials chosen, i.e., the mole fraction employed and the doping of the two semiconductor materials.

Figure 2:
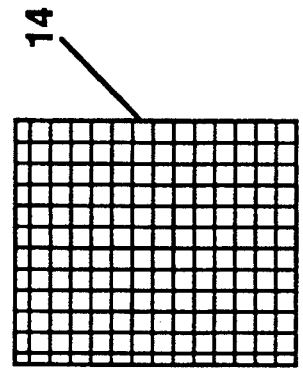
FIG. 2 is an end view of a second embodiment of the invention looking toward the P-type semiconductor material.

As shown in another embodiment in FIG. 2, the metallic ohmic contact 14 can take the form of a metallic grid structure deposited on the surface of the P-type material so that the density of electrons emitted from the P-type material may be modulated or totally secured thereto. In this instance the source 15 could take the form of a pulse or AC source with electron emission occurring only during the forward-biased half cycle.

Figure 3:
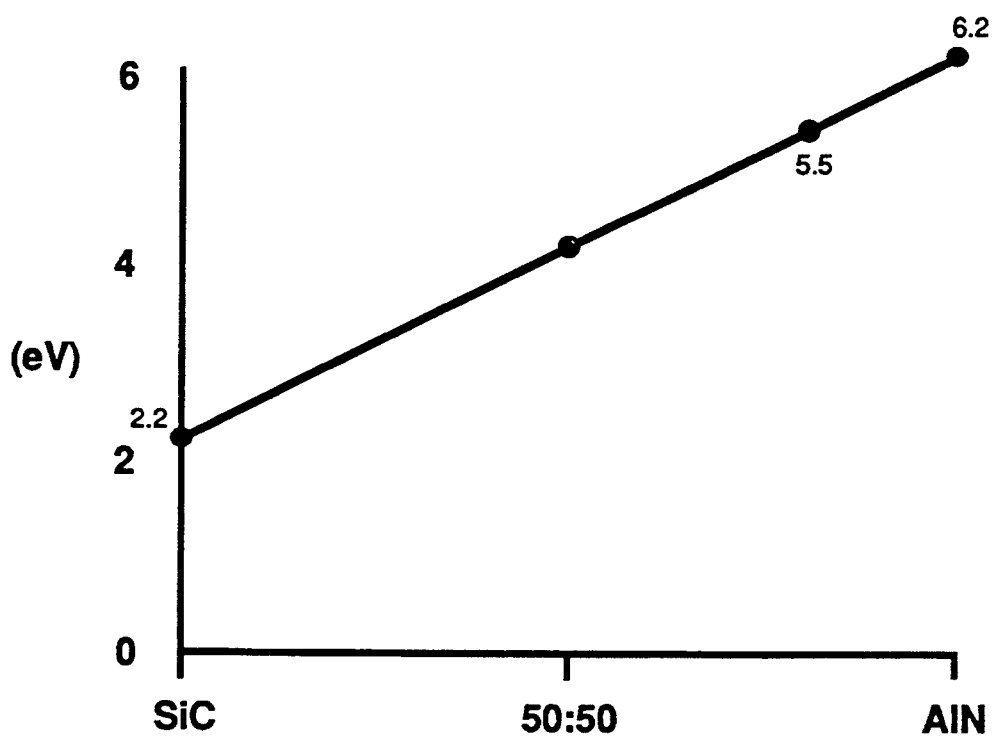
FIG. 3 is a graph showing the bandgap energy plotted against the mole composition of a semiconductor mixture of AlN and SiC.

FIG. 3 shows the band gap which results for various mixtures of AlN and SiC when combined to form an AlSiCN semiconductor. The AlSiCN so formed can then be impurity doped to provide an N-type material or a P-type material for use in our invention. The U.S. Pat. No. 4,382,837 discloses one method of fabricating an AlSiCN mixture and is hereby incorporated by reference into this application. Since the surface of the P-type material exhibits a negative electron affinity at mole fractions equivalent to a band gap of 5.5 eV or greater, these mole fractions have certain advantages.

In its simpliest form the invention uses AlN which has a bandgap of 6.2 eV in its wurtzitic structure and slightly less than that in its cubic form as the N-type semiconductor. Silicon Carbide which has a bandgap of 2.2 eV in its cubic form and nearly 3.3 eV in its 2H wurtzitic form is used as the P-type semiconductor material. AlN and SiC form a conventional type I heterojunction. As it relates to this invention, a type I heterojunction is known in the art as a junction in which the forbidden gap; which is defined as that energy gap not normally occupied by electrons and lying between the valence band and the conduction band; of the P-type material is completely within the forbidden gap of the N-type semiconductor material. The heterojunction offset potential between SiC and AlN is larger than any other known type I heterojunction. Unlike the GaAs/AlAs heterojunction, hot (high energy) electrons injected into the P-type SiC from AlN or into the P-type AlSiCN from AlN or a higher bandgap n-type AlSiCN alloy do not increase their mass and slow down because electron mass in the upper conduction band valley of SiC is actually less than it is in the main valley.

By virtue of the very large heterojunction offset potential between AlN and SiC conduction bands, e.g., up to 2.0 eV, and the very low electron affinity of the AlSiCN surface, e.g., between negative numbers and 1.0 eV depending on mole fraction composition, hot electrons can easily be injected from the N-type AlN into the P-type SiC or AlSiCN layers with energies sufficient to ballistically transit thin, e.g., <100 nanometers P-type SiC or AlSiCN surface layers and yet retain energy sufficient to exceed the electron affinity and work function of the surface. Since these heterojunction offset potentials can be precisely controlled by choice of mole fraction composition as depicted in FIG. 3, the energy of the electrons reaching the surface may be precisely controlled with respect to the vacuum level. This energy is nearly monoenergetic by virtue of the heterojunction offset potential, the absence of significant electron mass increase in the material, and the ballistic nature of the electrons in the P-type surface layer. The term ballistic is well known in the art to mean there is no or very little electron scattering in the thin P-type material. The monoenergetic nature of the emission is of great advantage when employed in vacuum tube amplifiers requiring low noise. For P-type mole fractions exhibiting band gaps exceeding 5.5 eV, the reqirement for ballistic action is eliminated—only minority carrier lifetime dominates efficiency.

I claim:

1. A cold electron emission device comprising:
a forward biased heterojunction semiconductor in which said heterojunction is formed by a P-type material which is SiC and an N-type material which is AlN;
a first metallic ohmic contact connected to said P-type material at one end of said junction;
a second metal ohmic contact connected to said N-type material at an opposite end of said junction; and
a voltage source with a positive and negative terminal; said positive terminal being connected to said first ohmic contact and said negative terminal being connected to said second ohmic contact.

2. The device of claim 1 in which said P-type material has a forbidden gap which lies completely within the range of the forbidden gap of the N-type material.

3. The device of claim 2 in which said P-type material is less than 100 nanometers thick.

4. A semiconductor cold electron emission device comprising:
an input terminal;
an output terminal;
a PN heterojunction formed at the interface of an N-type AlN mixture and a P-type SiC mixture and connected between said input terminal and said output terminal; and means connected between said input and output terminals to forward bias said heterojunction.

5. The device of claim 8 in which said output terminal consists of an ohmic metallic grid structure which is connected to the P-type mixture and is controlled by the bias means.

6. The device of claim 5 in which said bias means is a pulse source of sufficient voltage to forward-bias the heterojunction.

7. The device of claim 6 in which said SiC mixture is AlSiCN which is doped so as to form the P-type semiconductor material.

8. The device of claim 7 in which said AlN mixture is AlSiCN doped so as to form the N-type semiconductor material.

9. A cold electron emission device comprising: a forward biased heterojunction semiconductor in which said heterojunction is formed by a P-type material of AlSiCN and an N-type material of AlSiCN which has a higher AlN mole fraction than that of said P-type material;
a first metallic ohmic contact connected to said P-type material at one end of said junction;
a second metallic ohmic contact connected to said N-type material at an opposite end of said junction; and a voltage source with a positive and negative terminal; said positive terminal being connected to said first ohmic contact and said negative terminal being connected to said second ohmic contact.

10. The device of claim 9 in which said P-type material is less than 100 nanometers thick.

* * * * *